BIASED BRIDGE COUPLED BIPOLAR AMPLIFIER

Filed Oct. 24, 1967 2 Sheets-Sheet 1

INVENTORS
ROBERT F. HEIDECKER
JOSEPH R. LEONARDI
BY Earl C. Hancock
ATTORNEY

Dec. 30, 1969 R. F. HEIDECKER ET AL 3,487,320

BIASED BRIDGE COUPLED BIPOLAR AMPLIFIER

Filed Oct. 24, 1967 2 Sheets-Sheet 2

United States Patent Office 3,487,320

Patented Dec. 30, 1969

3,487,320

BIASED BRIDGE COUPLED BIPOLAR AMPLIFIER

Robert F. Heidecker and Joseph R. Leonardi, Boulder, Colo., assignors to International Business Machines Corporation, Armonk, N.Y., a corporation of New York Filed Oct. 24, 1967, Ser. No. 677,709
Int. Cl. H03f *3/18, 3/68, 3/04*
U.S. Cl. 330—13 10 Claims

ABSTRACT OF THE DISCLOSURE

An input signal is coupled into a complementary transistor amplifier by means of a biased diode coupler. A current source provides the diode coupler biasing and, if switching is included, can be used to sample the input signal into the amplifier. With continuous biasing, the device operates as a low distortion amplifier. The emitter-base circuits of the transistors for the complementary amplifier have a common mode coupling therein.

BACKGROUND OF THE INVENTION

Field of the invention

This invention relates to complementary amplifier circuits utilizing semiconductor devices such as transistors and the like. More particularly, this invention relates to amplifiers having relatively low distortion by compensating for the "dead zone" of a semiconductor device. The amplifier in accordance with the present invention is particularly useful both as a high fidelity amplifier and as a stable sampling amplifier.

Description of the prior art

In the past, bipolar signals were sampled or amplified by a wide variety of circuits, each of which required acceptance of disadvantages associated therewith. In one such configuration, the bipolar signal would be effectively split with one polarity being processed through one channel and the other polarity being processed through a parallel channel with the signals from both channels being recombined at the output. These channels required careful balancing to prevent distortion. Also, push-pull amplifiers were used which required careful matching of components and which also required the cessation of conduction of one of the amplifier devices before the other commenced conduction.

The complementary amplifier became a reality with the advent of semiconductive devices, since semiconductors of diverse conductivity types could be used. However, these devices required careful matching of the components if distortion was to be avoided. Unfortunately, the matching of semiconductors of opposite conductivity types is frequently difficult to the point of being impractical. In addition, semiconductor devices exhibit a so-called "dead zone" which is the result of a small base-to-emitter potential developed in the device itself as a result of a small current flow. This base-to-emitter voltage ($V_{be}$) will hold the transistor in a cut-off condition until sufficient base drive current is introduced. Thus, in the prior art complementary amplifiers, matched components or transistors had to be employed in order to avoid distorted amplification of different polarities of a varying input. Even with such matched semiconductors, a degree of distortion was introduced, particularly at the transition point, because of the adverse base-to-emitter potential.

Furthermore, whenever the prior complementary amplifying devices were employed for potential sampling purposes, complementary strobe pulses were required to gate the input signal into the amplifier in order to insure that both polarities are sampled.

SUMMARY OF THE INVENTION

The present invention provides an amplifier which can be used either as a bipolar sampling amplifier or as a linear, low distortion amplifier. An amplifier in accordance with the present invention effectively has zero crossover distortion with a relatively fast response time. The components utilized in the circuitry in accordance with the persent invention need not be matched and, in fact, can be operable with a relatively wide mismatch.

The foregoing results are realized in the present invention by utilizing a complementary amplifier including a pair of semiconductor devices of opposite conductivity types which have a common coupling in the base-to-emitter circuits thereof. The input signal to be sampled is coupled into this amplifier by means of a coupler device which is biased to permit or block the coupling. A current source is used to bias this coupler and can be switched in and out so as to selectively permit or block sampling of the input signal into the complementary amplifier as desired.

It is an object of this invention to provide amplification of a bipolar input signal.

Another object of the present invention is to provide an amplifier utilizing semiconductor devices which exhibits effectively zero crossover distortion.

It is another object of the present invention to provide a complementary semiconductor amplifier which is particularly useful for sampling bipolar input signals.

It is still another object of the present invention to sample input signals through a bi-directional coupling device in to a complementary semiconductor amplifier so that equivalence between the magnitude of the input signal and the output signal is attained.

A further object of the present invention is to provide a high fidelity amplifier using complementary amplifier semiconductor devices and a diode-type coupler which is biased through a current source or sources.

The foregoing and other objects, features and advantages of the invention will be apparent from the following more particuar description of the preferred embodiments of the invention as are illustrated in the accompanying drawings.

DESCRIPTION OF THE PREFERRED EMBODIMENTS

Figure 1:
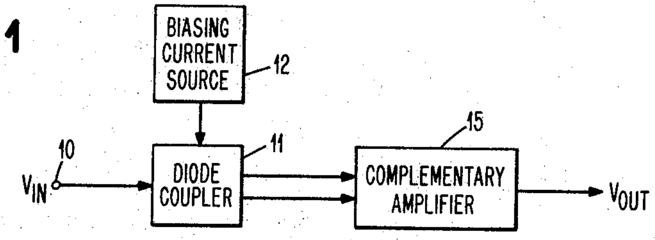
FIGURE 1 is an overall block diagram illustrating the general interrelationships of the major components of the subject invention.

FIGURE 1 provides a general presentation of the interrelationships of the major component blocks for the present invention. A bipolar signal which is to be sampled or amplified, $V_{in}$, is introduced to input terminal 10.

This signal will be passed or blocked by diode coupler 11 depending upon whether or not biasing current is being introduced to coupler 11 from current source 12. That is, diode coupler 11, when biased by current source 12 will pass the input signal from 10 to complementary amplifier 15. On the other hand, if the current source from 12 is not being introduced to diode coupler 11, then diode coupler 11 is effectively an open circuit between the input signal and complementary amplifier 15. Amplifier 15 will follow the input signal and provide an output signal, V*out*, which will be in direct relationship to the input signal with minimum distortion and with no adverse effects from the "dead zone" of the semiconductive devices used in complementary amplifier 15.

The circuitry of the present invention can be used to either sample the input signal at 10 by appropriately gating biasing current source 12 or, if biasing current source 12 is continuously introduced to diode coupler 11, the circuitry will operate as a linear amplifier. The circuit can sample and current amplify the bipolar signal with accuracy which is maintained at crossover because the circuit is not adversely affected by the "dead zone" of the transistors used. When used in the sampling mode, the circuit is nonsaturating which renders it inherently faster in operation. Also when used in the sampling mode, the output voltage is isolated from the input voltage, except during sampling time. The circuit maintains accuracy even when driving relatively low impedance loads with short sample times as compared to the prior art and is relatively independent of power supply variations.

Figure 2:
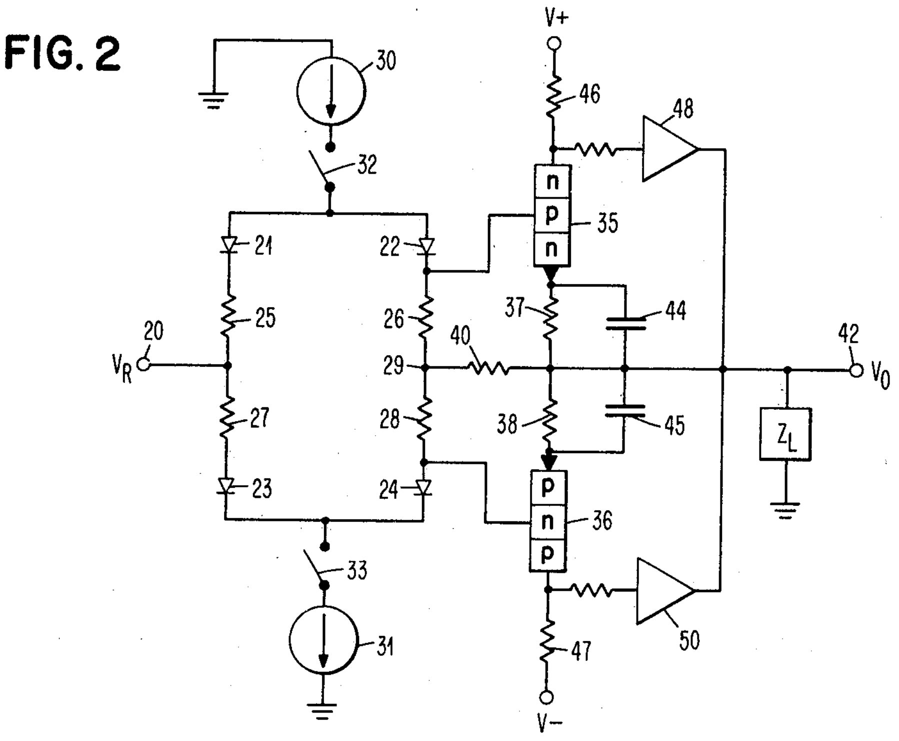
FIGURE 2 is a schematic diagram of an amplifier in accordance with the present invention employing a biased diode bridge for the coupling thereof.

FIGURE 2 illustrates a more detailed schematic diagram of the components utilized to perform the major operations generally described hereinabove for FIGURE 1. The circuitry as shown in FIGURE 2 employs a bridge-type diode coupler for sampling the input or reference voltage, V*r*, at terminal 20. This input signal is introduced to one node of a bridge circuit made up of diodes 21, 22, 23 and 24 along with resistors 25, 26, 27 and 28. A current source 30 and a current sink 31 are coupled across this bridge by means of switches 32 and 33.

Transistors 35 and 36 are serially coupled by resistors 37 and 38 between a positive power source, V+, and a negative power source , V−, in a complementary amplifier configuration. The emitter-base circuits of transistors 35 and 36 are commonly coupled through resistor 40. As is understood in the art, transistors 35 and 36 for providing complementary amplifier operation are of opposite conductivity types, these transistors being illustrated as shown for exemplary purposes only.

When switches 32 and 33 are open, the circuit will be inactive since all active elements will be off. That is, any signal that might be present at terminal 20 will be blocked from either of the amplifier transistors 35 and 36 because of diodes 21–24. The output will be developed at terminal 42 as a result of amplification through 35 and 36. However, when switches 32 and 33 are open, neither of transistors 35 or 36 will conduct and the output potential at 42 under normal static conditions would be 0 volts. When the input voltage, V*r*, is to be sampled, switches 32 and 33 would be closed. Depending upon the polarity of the input signal V*r* relative to the output voltage V*o*, the circuit will operate in one of two modes.

In the first mode, it is assumed that V*r* is a positive voltage greater than V*o* so that, initially, diodes 21 and 24 will be off. Accordingly, diodes 22 and 23, as well as transistor 35, will begin to conduct more heavily while transistor 36 will become cut off. The output voltage at terminal 42, V*o*, will be driven in a positive direction because of the conduction of transistor 35. As the magnitude of the output voltage approaches the input voltage, diodes 21 and 24 will begin to conduct and the drive signal into transistor 35 will reduce and eventually transistor 36 will begin conduction. When the output signal equals the input signal, the sum of the current through resistors 26 and 37 will equal the sum of the current through resistors 28 and 38 plus the current through Z1. The circuit will remain in this state until switches 32 and 33 are opened, at which time the circuit would return to its initial condition, except that the output voltage V*o* will approach the initial condition as a function of the output load impedance, Z1. If the output load were an RC network, for instance, the output signal would exponentially decay toward zero. If the output load were resistive only, the output signal would immediately drop to zero upon the opening of switches 32 and 33.

In the second operating mode, assume that the input voltage V*r* is more negative than the output voltage V*o*, such that diodes 22 and 23 are off. In this case, diodes 21 and 24 along with transistor 36 all will conduct and transistor 35 will be off. Accordingly, the output voltage will be driven in a negative direction. As the output voltage approaches the input voltage, diodes 22 and 23 turn on and the drive to transistor 36 will reduce until transistor 35 will commence conduction. When the output equals the input, the circuit will be balanced in a manner similar to the case for a positive sample and the turn off procedure is substantially the same, except that the output will be a negative signal.

It should be noted that when the input voltage is positive such that diode 21 is off, the current will flow through resistor 27 and diode 23 into current sink 31. Conversely, when a negative sample was applied to 20, diode 23 will be off and the current will flow from current source 30 through diode 21 and resistor 25 into the input terminal 20.

Under static conditions where no input is being introduced to terminal 20, the current which is being produced by source 30 and received by current sink 31 will divide in some proportion between the two branches of the bridge circuit. Both transistors 35 and 36 will be biased into conduction, but the currents therefrom will be effectively cancelled relative to the load. When the input voltage goes positive, the branch including diode 21 will accept less current and, therefore, an increment of current from source 30 will be forced into the base of transistor 35 through diode 22, thereby forcing this transistor into heavier conduction. At the same time, the input voltage will supply a portion of the current to sink 31 through diode 23 and transistor 36 will be forced into cut-off since less current can be accepted by sink 31 from diode 24. That is, the normal static current flow which would pass through diodes 22 and 24 and resistors 26 and 28 would hold these transistors in conduction. When input terminal 20 goes positive, the constant current from 30 cannot be accepted by diode 21 while the current requirements for 20 must be satisfied by constant current source 31 through diode 23. Therefore, 35 becomes heavily forward biased and 36 becomes back biased to cut-off. The potential at the junction of resistors 37 and 38 will approach the magnitude of the input potential at 20 and resistor 40 will accelerate the conduction of transistor 35. Conversely, it should be understood that sampling of a negative input voltage will cause a current through resistor 40 which will accelerate conduction transistor 36. When the bridge is balanced so that the potential at mode 29 equals the input potential, there will be no current flow through resistor 40 and the transistor 35 will maintain a constant level of output voltage so that the output potential at 42 will equal the potential both at node 29 and terminal 20.

Since the bridge is statically balanced with both transistors conducting, an alternating current at the input 20 when passing through zero will be reflected at the transistors 35 and 36 with both of these devices conducting. Therefore, the "dead zone" for these transistors will not cause any distortion as the current increase or decrease from zero. It would appear, however, that at some later point one of the transistors would suddenly cease conduction because of the base-to-emitter voltage and would cause some distortion in the waveform. However, in a practical embodiment of this circuit which was constructed in accordance with the basic underlying principles of the FIGURE 2 configuration, no discernable distortion could be found throughout the entire waveform for this amplifier. It is not readily understood why there is no distortion whatever, but it is believed there is some interrelationship of the circuitry as shown wherein the conducting transistor compensates for the sudden cut off of the other transistor during rising and fall times of input signals. The normal current flow increment from source 30 into source 31 through resistors 26 and 28 for static conditions will set the potentials for the bases of 35 and 36 relative to node 42 such that transistors 35 and 36 are in conduction. Thus, for all practical purposes, the current for static conditions through resistor 40 will be zero.

For typical prior art complementary amplifier transistors, the existence of V*be* potential which holds a transistor in cut off would result in the "dead zone" for this circuit. For instance, if a common input is introduced to the two serially connected transistors, the input must exceed this V*be* in either direction before any output whatsoever is produced. Thereafter, when the potential does exceed the conduction voltage required, the output waveform would be produced in a reduced magnitude with a distortion at the zero crossover point because of lack of conduction by either transistor.

Figure 5:
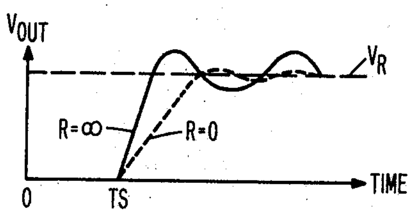
FIGURE 5 shows a hypothetical series of response curves based upon various possible values for the common coupling of a complementary amplifier using the present invention.

It should be appreciated that resistor 40 can range from a short circuit to an open circuit, depending upon the response desired. However, for high frequency sampling, resistor 40 would typically be included and chosen in conjunction with the high frequency parameters of the transistors and capacitors 44 and 45. For greater damping of the response, resistor 40 should be relatively small. That is, for normal operation of the circuitry with a short in place of resistance 40, the output voltage would rise less sharply to the input voltage level, but would exhibit less of a tendency to oscillate in a damped oscillation mode around that level. However, with the inclusion of the resistor appropriately chosen, the oscillations will tend to damp out less quickly. The inclusion of the resistor 40 also lowers the gain of the amplifier somewhat and the rise time of the output voltage is also somewhat reduced. The foregoing is illustrated in FIGURE 5 showing the response at the sampling time, TS, for a range of values for resistor 40 (noted as R in the drawing) from a short circuit to a relatively large resistance.

Capacitors 44 and 45 can be included if desired to improve the high frequency response of the circuitry when driving a varying load in particular. Otherwise, with a varying load, the output will tend to ring somewhat before stabilization. With a relatively fixed load, whether it be reactive or otherwise, and a fixed maximum operating frequency, judicious selection of components can be sufficient to avoid the necessity for inclusion of capacitors 44 and 45.

To increase the gain of the circuit operation, resistors 46 and 47 can be included to drive amplifier stages 48 and 50, respectively. Thus, these additional cascaded amplifier stages 48 and 50 can compensate for gain lost from inclusion of resistor 40 and still realize the increased stability from use of this resistor. The circuit may be modified to operate as a linear complementary amplifier exhibiting no cross-over distortion without using matched semiconductor devices. This can be accomplished by short circuiting switches 32 and 33. Under these conditions, it may be possible also to short diodes 21–24. In the event that the circuitry is desired for sampling operation only, resistors 25–28 and 37 and 38 can be short-circuited although this could result in some cross-over distortion being introduced.

Although the transistors used for the complementary amplifier of the FIGURE 2 circuitry need not be balanced without seriously deteriorating the fidelity of the response of the circuitry, it is preferable that the transistors 35 and 36 be made of the same general semiconductor material. It is also preferable that the bridge circuit components be nominally balanced, but it is not necessary that these components be matched.

Figure 3:
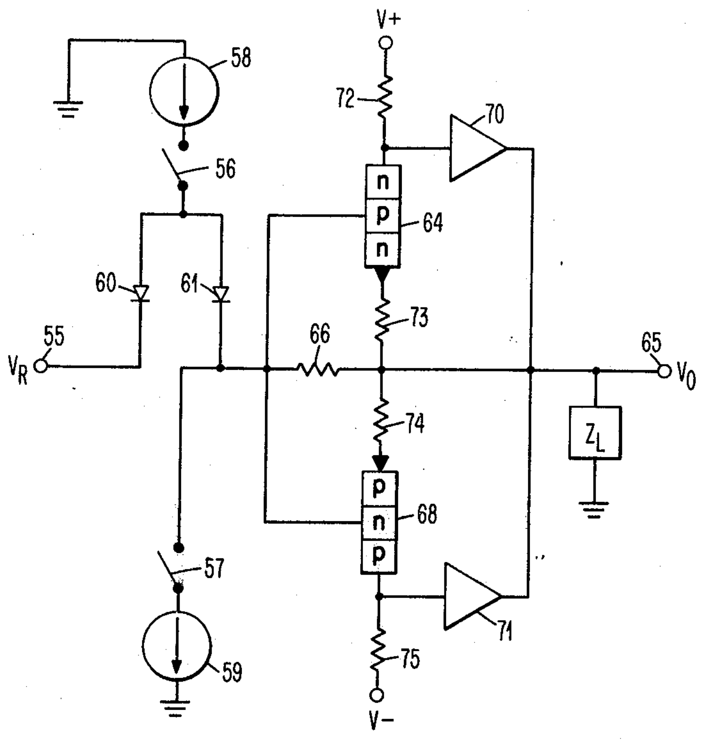
FIGURE 3 is a schematic illustration of another embodiment of the present invention employing a simplified diode coupler.

FIGURE 3 of the present invention illustrates yet another manner of coupling between the complementary amplifier and an input signal to be sampled. The input signal introduced at terminal 55 can be bipolar. When switches 56 and 57 are open, current sources 58 and 59 will be isolated from coupling diodes 60 and 61. Current source 59 operates as a current sink in substantially the same manner as current source 31 in FIGURE 2. With switches 56 and 57 open, the input signal V*r* is isolated from the amplifier stages because of the presence of diodes 60 and 61. To sample the input voltage, switches 56 and 57 are closed. The circuit will enter either of two modes of operation depending upon the polarity of the input voltage relative to the output voltage at the time the switches 56 and 57 are closed.

Assuming that the input voltage is positive and greater than the output voltage such that diode 60 is off, then diode 61 and transistor 64 will conduct. Accordingly, the output voltage, V*o*, at output terminal 65 will be driven positive until transistor 64 begins to turn off, at which time the output voltage will approach the input voltage. The stabilized output voltage may vary somewhat from the input voltage in practical cases. The voltage error can be made very small by making resistor 66 much less than the resistance of the load Z1 and using germanium semiconductors and/or matched diodes. The output voltage will be maintained very near the input voltage until switches 56 and 57 are opened, at which time the circuit returns to the initial condition state except that the output voltage will be a function of the load impedance, Z1, in the same manner as described hereinbefore for FIGURE 2.

Assuming that the input voltage is more negative than the output voltage such that diode 60 is on, then diode 61 will be off and all of the current from the current source 59 will pass through resistor 66 and the base of transistor 68. Accordingly, 64 will be off and 68 on, driving the output voltage in the negative direction. As the output voltage approaches the input voltage, 68 turns off and the circuit is balanced as it is in the case for the positive sample and the turn off procedure is the same.

The magnitude of current produced by current source 58 in the FIGURE 3 circuitry must be approximately twice that of the current being produced by source 59 so as to produce relatively equal drive to the complementary amplifier transistors and resistance 66 for both negative and positive sampling. This can be understood when it is recognized that when diode 61 is conducting, the current produced from source 58 must be able to drive current through resistance 66 in opposition to current required for sink current source 59, which is operating as a current sink in this configuration. Thus, the output of source 58 must be able to neutralize source 59 as well as to drive transistor 64 into conduction during positive potential at terminal 55.

If the additional gain is desired from the circuitry shown, amplifiers 70 and 71 can be included along with resistors 72, 73, 74 and 75. For unity current gain between the input and output potentials, transistors 64 and 68 can be removed and resistor 66 shorted, which would result in direct coupling of the input voltage to the output terminal 65.

Figure 4:
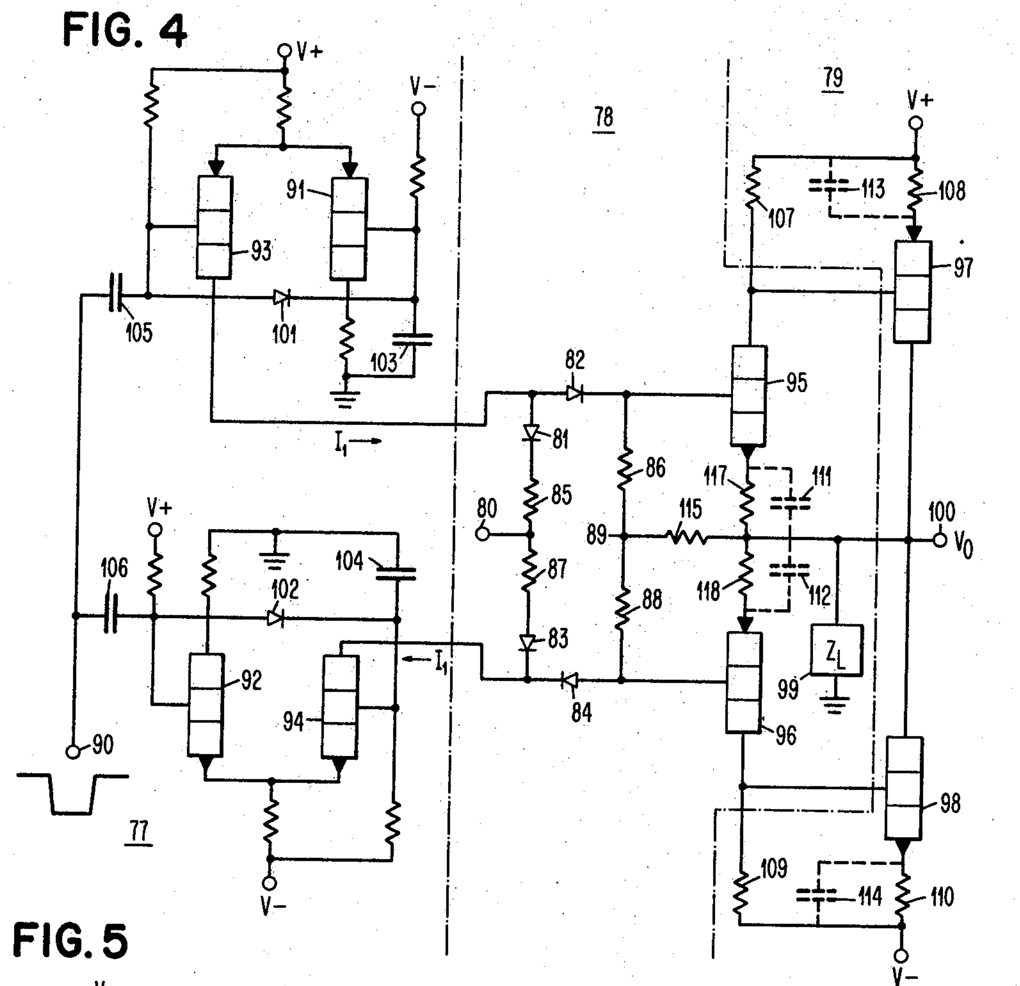
FIGURE 4 is a detailed schematic diagram of circuitry employing the present invention including specific arrangements for providing current sources and gating inputs.

FIGURE 4 illustrates, in greater detail, the utilization of the present invention. The circuitry shown generally in the area indicated by the reference 77 provides the biasing and switching functions performed by sources 30 and 31 and switches 32 and 33 in FIGURE 2. The diode bridge comparator and complementary amplifier circuitry shown generally in block 78 of FIGURE 4 is directly analagous to the operation described hereinbefore for FIGURE 2 for the analogous components. In addition, the amplifier stages shown generally in block 79 of FIGURE 4 show in detail one manner of providing cascaded amplification for each of the transistors of the complementary amplifier. The circuitry shown in FIGURE 4 is considerably faster when driving a low impedance load than prior art circuits and does not exhibit a "dead zone" which causes sampling errors or lost samples.

The FIGURE 4 circuitry uses a unipolar input pulse for introduction to terminal 90. That is, the circuitry shown in FIGURE 4 does not require bipolar gating pulses but uses a single such gating pulse. The circuit is non-saturating and, thus, is inherently faster than prior art circuitry. The circuitry has the same zero crossover distortion and short sampling times as discussed hereinbefore for FIGURE 2. In addition, the FIGURE 4 circuitry using the current switch feature shown eliminates erroneous bias on the load at the end of a sample. It should be appreciated that the complementary strobe pulses required by prior art circuits are avoided by the FIGURE 4 circuitry.

For the initial stable current conditions with no input, transistors 91 and 92 are on while transistors 93 and 94, as well as transistors 95, 96, 97 and 98, are all off. As a result, diodes 81–84 are also all off. Under static conditions, the output voltage $V_o$ at terminal 100 would be zero and current $I_1$ would also be zero. With no input signal, diode 101 will be on and the base of transistor 91 will be more negative than the base of transistor 93. Therefore, transistor 91 will conduct. For similar reasoning, relative to diode 102, transistor 92 will be in conduction and transistor 94 will be held off.

When the strobe pulse in introduced to terminal 90 as is illustrated in the drawing, it is capacitively coupled to the bases of transistors 92 and 93 and transistors 91 and 92 will be turned off, while transistors 93 and 94 will commence conduction because of current switch action. That is, since diodes 101 and 102 were back-biased by the pulse and capacitors 103 and 104 hold the potentials originally determined by diodes 101 and 102, these potentials will force the transistors 91 and 92 to cease conduction. It should be noted that the sampling pulse introduction to terminal 90 should be equal to or greater than twice the diode drops of either diodes 101 or 102, in order to insure switching of the circuitry. Thus, transistors 91 and 92 substantially perform the same function as switches 32 and 33 in FIGURE 2 and cause transistors 93 and 94 to bias the bridge circuitry in block 78 with biasing current $I_1$. After the strobe pulse has been introduced to terminal 90, the bridge circuit samples the input at terminal 80 and introduces it to the complementary amplifier transistors 95 and 96 which will operate in the same manner as described hereinbefore for FIGURE 2. Upon removal of the strobe pulse from terminal 90, the output voltage at terminal 100 will reduce to zero, depending upon the type of load impedance 99 that is being utilized. Capacitors 103 and 104 along with coupling capacitors 105 and 106 exhibit a relatively low impedance at the operating frequency of the strobing pulses.

Transistors 97 and 98 along with resistances 107, 108, 109 and 110 in association therewith provide power amplification to provide additional current gain which may be required for very low impedance loads. Capacitors 111, 112, 113 and 114 can be added to improve frequency response for substantially the same reasons as discussed for FIGURE 2. Positive strobe pulses may be used by interchanging the collectors of transistors 91 and 93 and the collectors of transistors 92 and 94 and the circuit bias such that transistors 91 and 92 are off and transistors 93 and 94 are on, initially.

A practical circuit in accordance with the configuration shown in FIGURE 4 has been constructed and successfully operated up to 300 magahertz as a linear amplifier with no discernable distortion. The circuit used in a sampling mode can be generally anticipated as having up to a 20 nanosecond response time. However, the particular circuit constructed pursuant to FIGURE 4 used a 100 nanosecond sampling pulse at the 50% points for the input to 90. A short circuit was used for resistor 115 and the load impedance 99 was a 1K ohm resistance in parallel with a capacitance which, at one point or another in the test, had values of .001 $\mu$f., .002 $\mu$f., .003 $\mu$f., and .0059 $\mu$f. The transistors and diodes were all high frequency silicon devices and otherwise the component values were as follows:

| Component: | | Value |
|---|---|---|
| **85** and **87** | ohms | 80.6 |
| **86** and **88** | do | 40.2 |
| **103–106** | $\mu$f | .033 |
| **107** and **109** | ohms | 51 |
| **108** and **110** | do | 12 |
| **111–114** (200 $\mu\mu$f.) | pf | 200 |
| **115** | ohms | 0 |
| **117** and **118** | do | 10 |

While the invention has been particularly described and shown relative to the foregoing embodiments, it will be understood by those having normal skill in the art that various other changes and modifications may be made without departing from the spirit of this invention.

What is claimed is:

1. An amplifier comprising:

a source of input signals;

a pair of semiconducting devices connected as a complementary amplifier;

at least two pairs of unidirectional conducting means arranged in a bridge configuration with one of said pairs providing a first current path across said bridge and the other of said pairs providing a second current path across said bridge, said input source being coupled to the juncture between said one pair, said complementary amplifier being coupled to the juncture between said other pair; and current source means coupled across said first and second current paths of said bridge for biasing said unidirectional conducting means;

said unidirectional conducting means being arranged for coupling said input source to said amplifier in the presence of biasing current from said current source means and for isolating said input source from said amplifier in the absence of said biasing current.

2. An amplifier in accordance with claim 1 wherein, said current source means includes a first and second current source;

said pairs of unidirectional conducting means are at least two pairs of serially connected diodes with said pairs being arranged in said bridge configuration, each of said pairs being coupled to provide separate conduction paths from said first current source into said second current source:

said input source being coupled to the common junction of the diodes in one of said pairs of diodes and said amplifier being coupled to the common junction of the other of said pairs of diodes.

3. An amplifier in accordance with claim 2 which includes:

first and second switch means for selectably coupling said first and second current sources, respectively, to said diode pairs;

whereby the signal present at said input source can be sampled into said amplifier whenever said switch means are closed.

4. An amplifier comprising:

a source of input signals;

first and second current sources;

first and second diodes commonly coupled on one side to said first current source;

third and fourth diodes commonly coupled to said second current source;

first and second resistive means serially connected between the other sides of said first and third diodes for providing a current path from said first current source into said second current source;

said input source being connected to the common juncture between said first and second resistive means, third and fourth resistive means serially connected between the other sides of said second and fourth diodes for providing a second current path between said current sources;

fifth and sixth resistive means;

first and second transistors of opposite conductivity types serially connected through said fifth and sixth resistive means in a complementary amplifier configuration;

said third and fifth resistive means being coupled for completing the base-emitter circuit of said first transistor and said fourth and sixth resistive means being coupled for completing the base-emitter circuit of said second transistor; and output means connected to the common juncture of said fifth and sixth resistive means;

5. An amplifier in accordance with claim 4 which includes:

first and second switching means for selectably coupling and isolating said first and second current sources, respectively, relative to said current paths.

6. An amplifier in accordance with claim 5 wherein, said first and second current sources are third and fourth transistors, respectively;

said first and second switching means are fifth and sixth transistors, respectively;

means for concurrently introducing gating signals into said fifth and sixth transistors;

said fifth and sixth transistors being coupled for causing conduction of said third and fourth transistors, respectively, in response to said gating signals.

7. An amplifier in accordance with claim 6 which further includes:

a seventh resistive means coupling the common juncture of said third and fourth resistive means with the common juncture of said fifth and sixth resistive means; and first and second amplifiers connected between the collector circuits of said first and second transistors, respectively, and said output means.

8. An amplifier comprising:

an input source;

a pair of semiconductors connected serially as a complementary amplifier;

first and second current sources;

first and second diodes, said second diode being connected between said first and second current sources for providing a path for current flow therebetween, said first diode being coupled to the juncture between said second diode and said first current source for providing a current path from said first current source to said input source, and said amplifier being coupled to the juncture between said second diode and said second current source, said diodes being arranged for coupling said input source to the input of said amplifier in the presence of biasing current from said sources and for isolating said input source from the input to said amplifier in the absence of biasing current from said sources.

9. An amplifier in accordance with claim 8 which further includes:

switching means for selectably coupling and isolating said biasing sources from said diodes whereby signals at said input source will be sampled by said amplifier when said switching means are closed.

10. An amplifier in accordance with claim 8 wherein said semiconductors are of opposite conductivity types and said second current source produces a current having a magnitude of approximately twice that of said first current source.

References Cited

UNITED STATES PATENTS

| | | | |
|---|---|---|---|
| 3,077,545 | 2/1963 | Rywak | 330—13 X |
| 3,127,564 | 3/1964 | Giger | 307—321 X |
| 3,363,191 | 1/1968 | Boughtwood et al. | 330—13 X |
| 3,375,455 | 3/1968 | Motta | 330—13 |

ROY LAKE, Primary Examiner

LAWRENCE J. DAHL, Assistant Examiner

U.S. Cl. X.R.

330—17, 24